(12) United States Patent
Yang et al.

(10) Patent No.: US 11,302,673 B2
(45) Date of Patent: Apr. 12, 2022

(54) SEMICONDUCTOR DEVICE INCLUDING VERTICALLY STACKED SEMICONDUCTOR DIES

(71) Applicant: WESTERN DIGITAL TECHNOLOGIES, INC., San Jose, CA (US)

(72) Inventors: Xuyi Yang, Shanghai (CN); Cong Zhang, Shanghai (CN); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/818,883

(22) Filed: Mar. 13, 2020

(65) Prior Publication Data
US 2020/0411481 A1 Dec. 31, 2020

(30) Foreign Application Priority Data
Jun. 28, 2019 (CN) .......................... 201910577136.1

(51) Int. Cl.
*H01L 25/18* (2006.01)
*H01L 25/065* (2006.01)
*H01L 25/00* (2006.01)

(52) U.S. Cl.
CPC .......... *H01L 25/0657* (2013.01); *H01L 25/18* (2013.01); *H01L 25/50* (2013.01); *H01L 2225/06551* (2013.01); *H01L 2225/06586* (2013.01)

(58) Field of Classification Search
CPC ..... H01L 25/0657; H01L 25/18; H01L 25/50; H01L 2225/06551; H01L 2225/06586
See application file for complete search history.

(56) References Cited

U.S. PATENT DOCUMENTS

| | | | |
|---|---|---|---|
| 2015/0318261 A1* | 11/2015 | Chung | .................. H01L 21/561 257/774 |
| 2018/0040587 A1 | 2/2018 | Tao et al. | |
| 2018/0114773 A1* | 4/2018 | Chiu | ....................... H01L 24/25 |
| 2018/0308788 A1 | 10/2018 | Park et al. | |
| 2019/0214366 A1* | 7/2019 | Chen | ................. H01L 21/76898 |

FOREIGN PATENT DOCUMENTS

WO    2015199817    12/2015

\* cited by examiner

*Primary Examiner* — Timor Karimy
(74) *Attorney, Agent, or Firm* — Vierra Magen Marcus LLP (57) ABSTRACT

A semiconductor device is disclosed including one or more stacks of semiconductor dies vertically molded together in an encapsulated block. The semiconductor dies may comprise memory dies, or memory dies and a controller die.

20 Claims, 12 Drawing Sheets

SEMICONDUCTOR DEVICE INCLUDING VERTICALLY STACKED SEMICONDUCTOR DIES

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a mold compound which provides a protective package.

There is currently a push to provide high density memory devices for use in solid state memory drives. One way to provide high density memory devices is to stack semiconductor dies on top of each other. In order to provide access to bond pads on the semiconductor dies, the dies are stacked, either with an offset allowing wire bonds for electrical connection, or completely overlapped allowing through silicon vias (TSV) electrical connection. Overlapped dies connected using TSV provide a high density memory solution. However, TSV is an expensive process and requires additional components such as an interposer to connect to a host device.

DETAILED DESCRIPTION

The present technology will now be described with reference to the figures, which in embodiments, relate to a semiconductor device including semiconductor dies stacked with an aligned active edge for receiving a redistribution layer (RDL) providing a high density fan out memory device. In embodiments, the semiconductor device comprises a plurality of NAND die stacks, with or without a controller ASIC, wherein each stack has a planar active sidewall connected to a common RDL on which are provided an array of balls (BGA) for fan-out.

In another embodiment, the present technology relates to a semiconductor device which is singulated as a package to include a single NAND die stack, with or without a controller ASIC, wherein the BGA may be connected to the ASIC (or other) semiconductor bond pads by through-mold vias (TMVs) formed through the mold compound.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
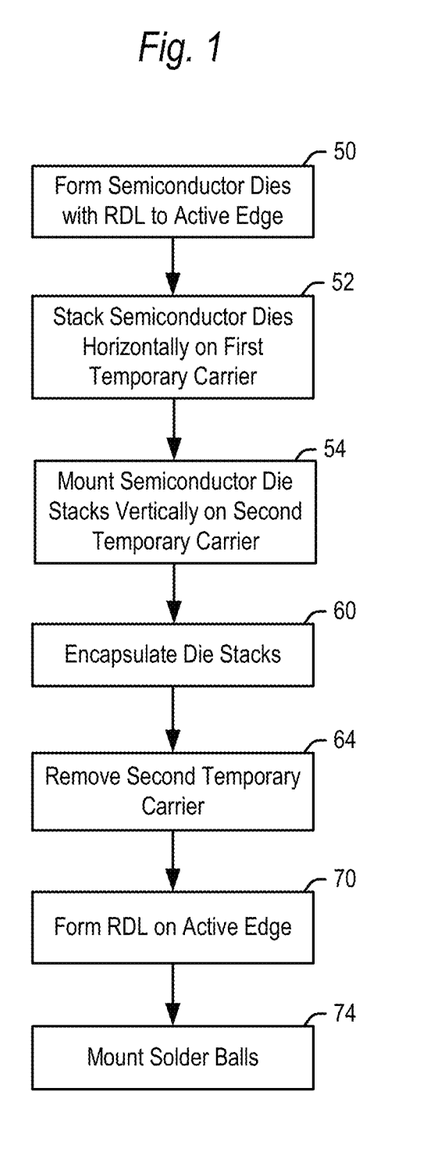
FIG. 1 is a flowchart for forming a semiconductor device according to embodiments of the present technology.
Figure 11:
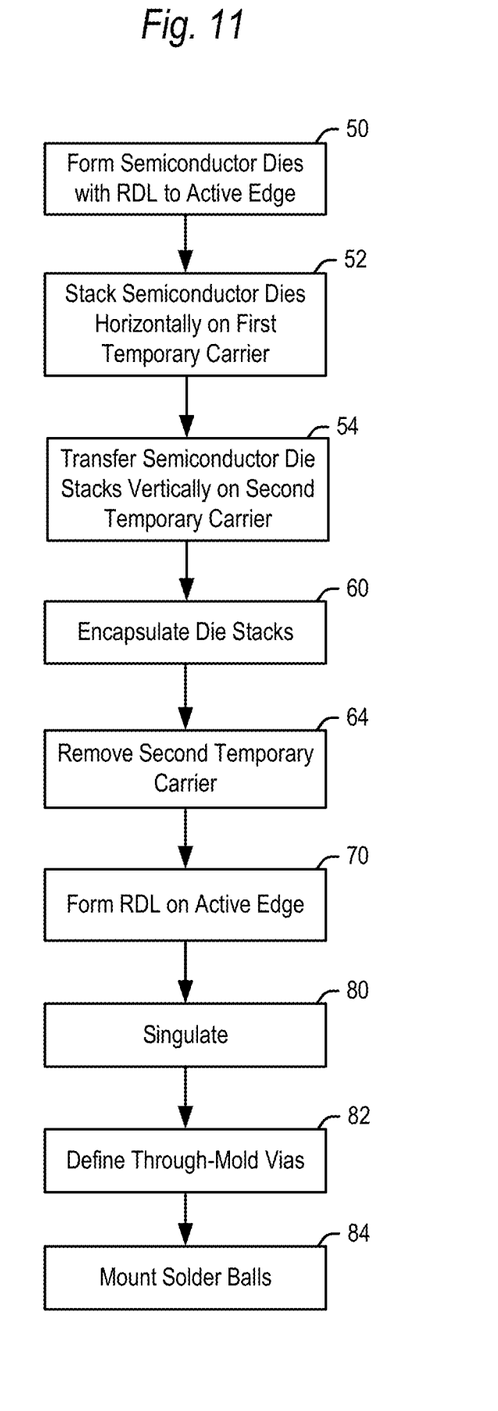
FIG. 11 is a flowchart for forming a semiconductor device according to an alternative embodiment of the present technology.

Embodiments of the present technology will now be explained with reference to the flowcharts of FIGS. 1 and 11, and the views of FIGS. 2-10 and 12-23. In step 50, a semiconductor wafer (not shown) may be processed into a number of semiconductor dies 102, one of which is shown in perspective view in FIG. 2. The semiconductor die 102 may undergo various processes in step 50 to form integrated circuits on and/or in a first major surface 104 of semiconductor die 102. After formation of the integrated circuits, internal electrical connections may be formed within the semiconductor die 102, connecting the integrated circuits to bond pads 108 on the first major surface 104 of semiconductor die 102.

Figure 2:
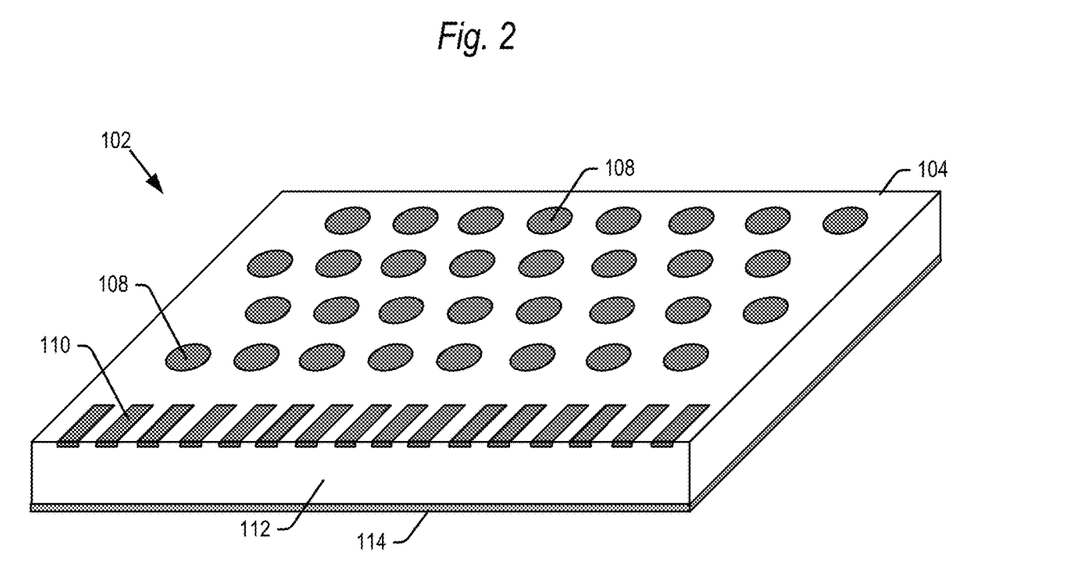
FIG. 2 is a perspective view of a semiconductor die according to embodiments of the present technology.

Electrical interconnections on or in semiconductor die 102 may further electrically couple the bond pads 108 to edge pads 110. Edge pads 110 may be formed on the first major surface 104, and may extend to an active edge 112 a semiconductor die 102, extending generally perpendicularly from the first major surface 104. As shown in FIG. 2, a portion of the edge pads 110 are exposed at the active edge 112. Instead of edge pads 108, electrical traces may be formed on or in the semiconductor die 102, extending between the bond pads 108 and the active edge 112.

The pattern and number of bond pads 108 and edge pads 110 shown in FIG. 2 is by way of example only. There may be more or less bond pads 108 and/or edge pads 110, in other patterns, in further embodiments. A bottom surface of die 102 (opposite major surface 104) may include a die attach film (DAF) layer 114 enabling stacking of the semiconductor dies 102.

The semiconductor dies 102 may for example be flash memory die such as 2D NAND flash memory or 3D BiCS (Bit Cost Scaling), V-NAND or other 3D flash memory, but other types of dies 102 may be used. These other types of semiconductor dies include but are not limited to controller dies such as an ASIC, or RAM such as an SDRAM, DDR SDRAM, LPDDR and GDDR.

Figure 3:
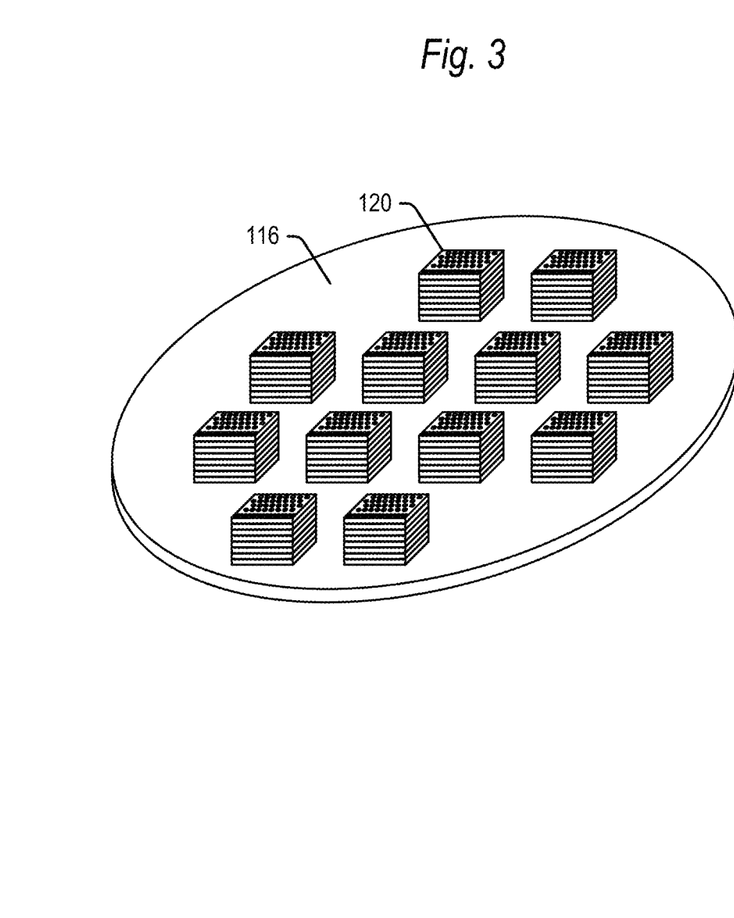
FIG. 3 is a perspective view of a number of die stacks supported on a first temporary carrier according to embodiments of the present technology.

In step 52, one or more semiconductor dies 102 may be stacked on a first temporary carrier 116. As shown in FIG. 3, a number of such die stacks 120 may be formed on the first temporary carrier 116. The number of stacks 120 shown on carrier 116 in FIG. 3 is by way of example only, and may vary in further embodiments. The temporary carrier 116 can for example be metal, glass or silicon. The individual semiconductor dies 102 may be stacked on each other using the DAF layer 114 cured to a b-stage. The bottommost die 102 of each stack 120 may be adhered to the temporary carrier 116 using the DAF layer 114 of the bottommost die, or a temporary adhesive. Such a temporary adhesive can be a laser/UV light releasing type film, a thermal releasing type film or a mechanical releasing type film to allow easy detachment of the die stacks 120 as explained below.

Figure 4:
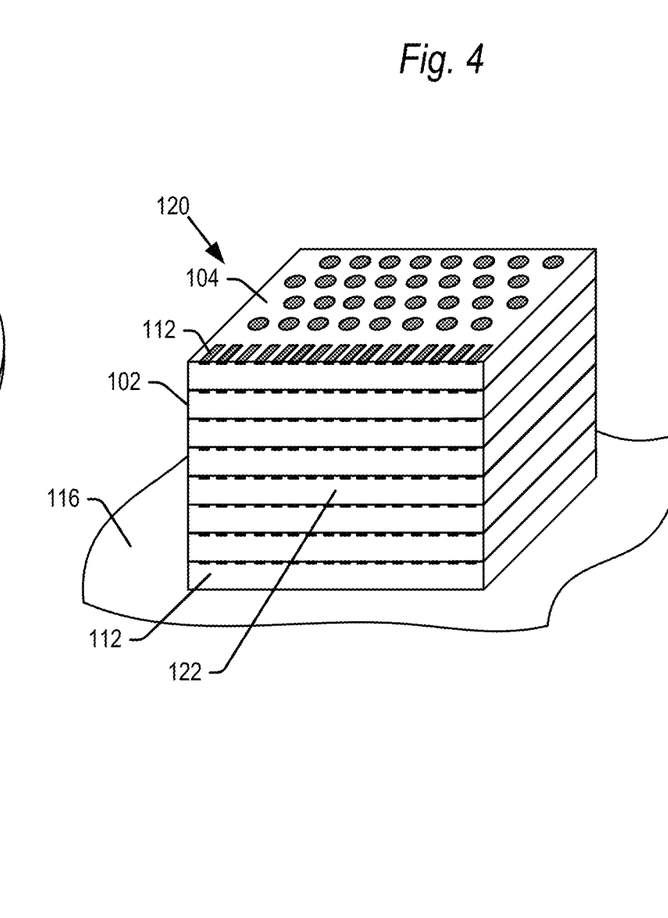
FIG. 4 is a perspective view of a semiconductor die stack supported on the temporary carrier of FIG. 3, with the active surface facing outward.

As shown in the perspective view of FIG. 4, the semiconductor dies 102 may be mounted in the respective stacks 120 with the major surface 104 facing upward, i.e., facing away from the temporary carrier 116. The number of dies 102 shown in the stack 120 is by way of example only, and embodiments may include different numbers of semiconductor dies, including for example 1, 2, 4, 8, 16, 32, 64 or 128 dies. There may be other numbers of dies in further embodiments. The active edges 112 of each of the semiconductor dies 102 are aligned with each other to form a planar active sidewall 122. The edge pads 112 of each of the respective dies 102 are exposed at the planar active sidewall 122.

Figure 5:
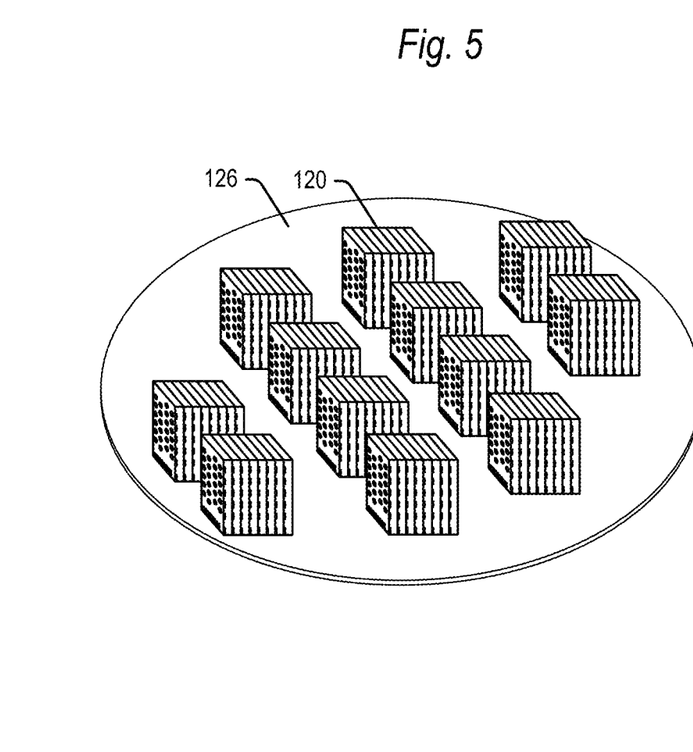
FIG. 5 is a perspective view of a number of die stacks supported on a second temporary carrier according to embodiments of the present technology.
Figure 6:
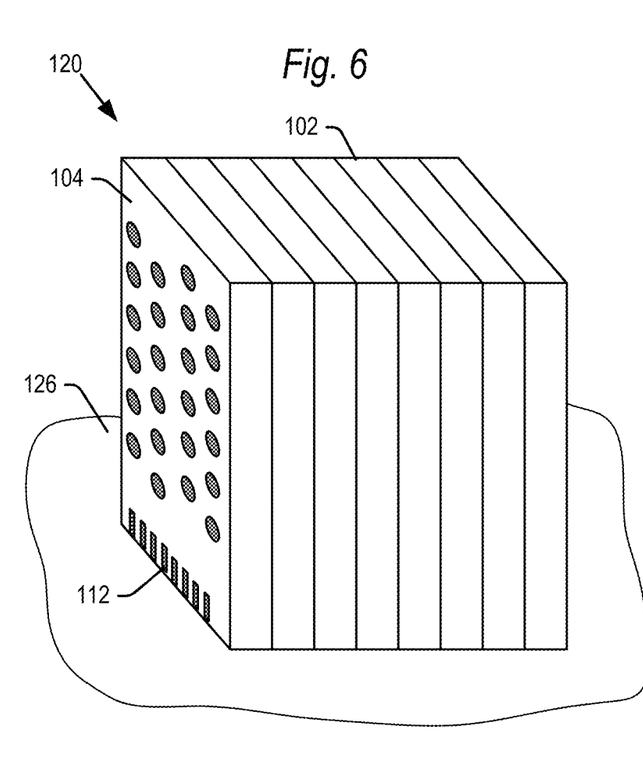
FIG. 6 is a perspective view of a semiconductor die stack supported on the temporary carrier of FIG. 5, with the active surface facing downward.

The die stacks 120 may be removed from the first temporary carrier (by applying laser/UV light, heat and/or force, depending on the temporary adhesive), and mounted on a second temporary carrier 126 in step 54. As shown in FIGS. 5 and 6, the die stacks 120 may be mounted on the second temporary carrier 126 with the active sidewall 122 facing downward against the second temporary carrier 126. The dies 102 in stack 120 may be heated and/or a force may be exerted against one or more of the dies 102 to ensure that the dies lie flat against second temporary carrier 126, to ensure the planarity of active sidewall 122.

The number of stacks 120 shown on the second temporary carrier 126 in FIG. 5 is by way of example only, and may vary in further embodiments. The second temporary carrier 126 can for example be metal, glass or silicon, and may or may not be the same material as the first temporary carrier 116. The die stacks 120 may be adhered to the second temporary carrier 126 using a temporary adhesive, such as for example a laser/UV releasing type film, a thermal releasing type film or a mechanical releasing type film to allow easy detachment of the die stacks 120 as explained below.

Figure 7:
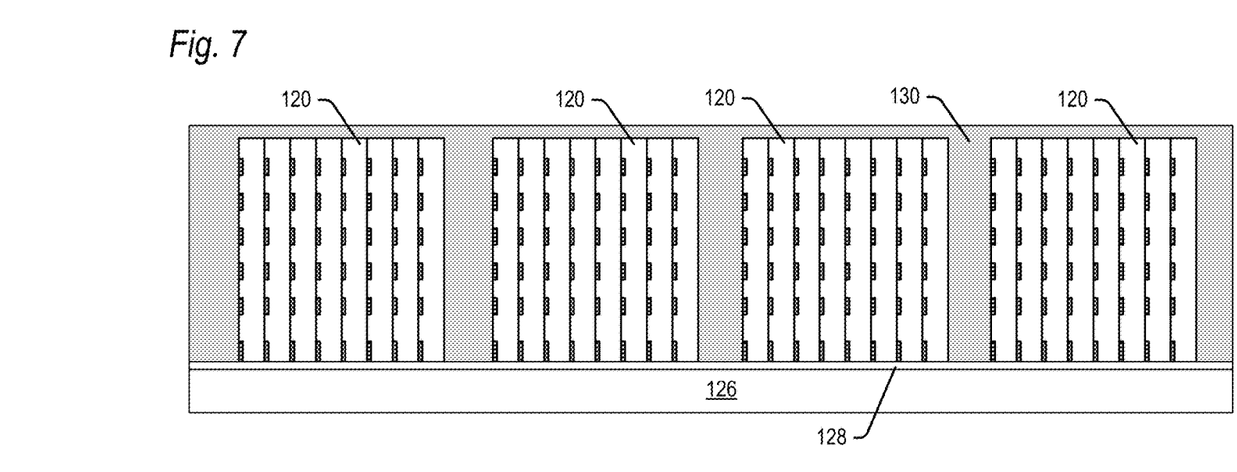
FIG. 7 is a cross-sectional edge view of semiconductor die stacks supported on a temporary carrier of FIG. 5 after encapsulation.

In step 60, the die stacks 120 may next be encapsulated in a mold compound 130 as shown in the cross-sectional edge view of FIG. 7. Mold compound 130 may include for example solid epoxy resin, Phenol resin, fused silica, crystalline silica, carbon black and/or metal hydroxide. Other mold compounds are contemplated. The mold compound may be applied by various known processes, including by compression molding, FFT (flow free thin) molding, transfer molding or injection molding techniques.

Figure 8:
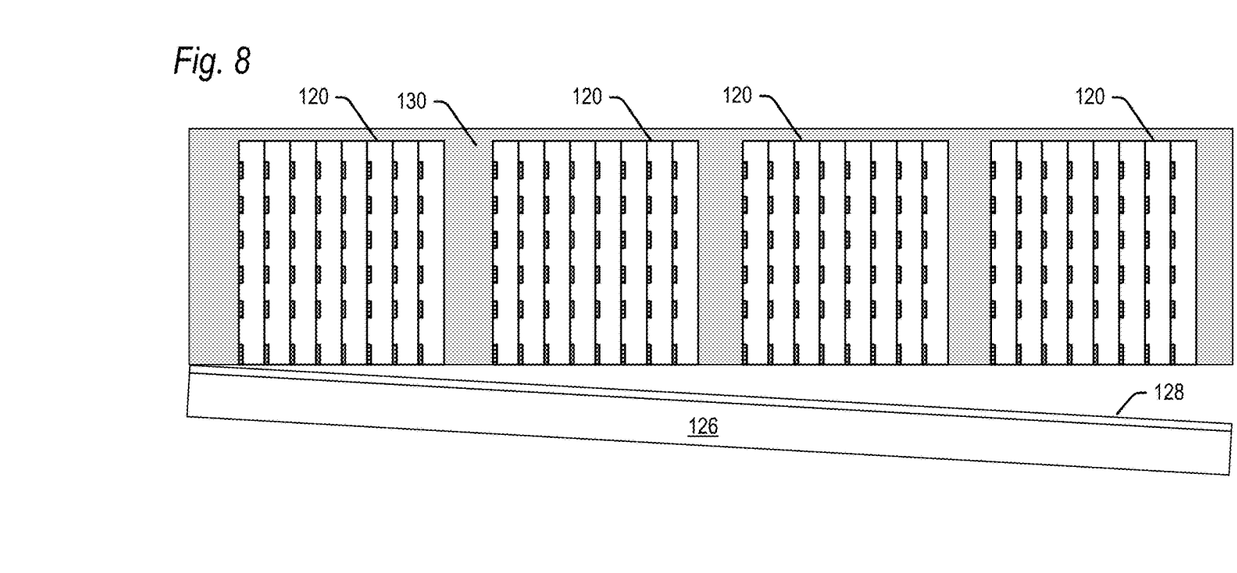
FIG. 8 is a cross-sectional edge view of encapsulated semiconductor die stacks with the temporary carrier of FIG. 5 being removed.

Once the mold compound 130 has hardened, the second temporary carrier 126 may be removed in step 64 as indicated in the cross-sectional edge view of FIG. 8. As above, the second temporary carrier 126 may be removed by applying laser/UV light, heat and/or force to the temporary adhesive 128 of the second carrier 126.

After step 64, the encapsulated die stacks 120 may be inverted so that the active sidewalls 122 of the stacks 120 (previously mounted against the second temporary carrier 126) face upward. In step 70, a redistribution layer (RDL) 134 may be formed over the active sidewalls 122 of each of the die stacks 120 in mold compound 130 as shown in the cross-sectional edge view of FIG. 9. The RDL 134 may have a first surface 136 with a pattern of solder bumps configured to physically and electrically mate with some or all of the edge pads 112 exposed in the active sidewall 122. The first surface 136 of RDL 134 may be adhered to the active sidewalls 122 by an adhesive layer on the first surface 136 and/or by coupling of the solder bumps to the edge pads 112.

Figure 9:
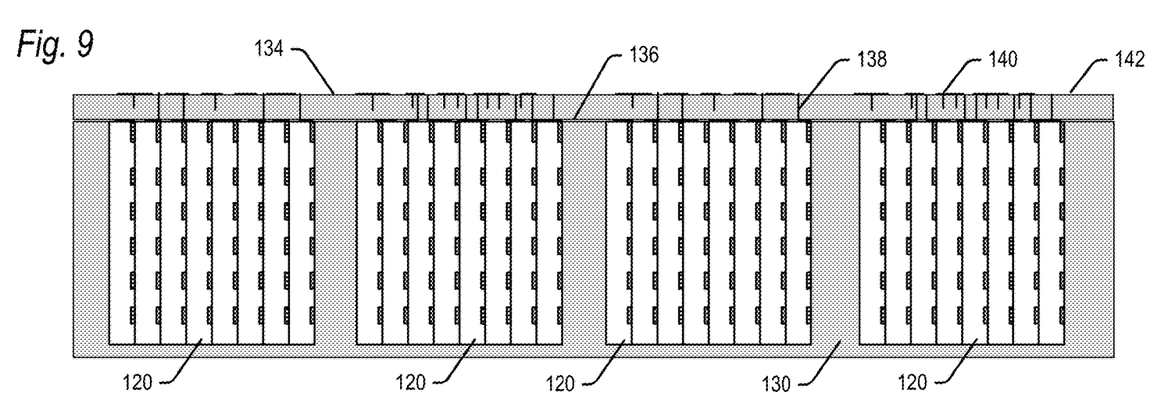
FIG. 9 is a cross-sectional edge view of the encapsulated semiconductor die stacks of FIG. 8, inverted, and including an RDL layer.

The RDL 134 may further include an internal pattern of metal interconnects 138 coupling the pattern of solder bumps on first surface 136 to a pattern of contact pads 140 distributed across a second surface 142 of RDL 134. The RDL 134 electrically redistributes the edge pads 112 to the fan-out pattern of contact pads 140 on the second surface 142. The contact pads 140 may be distributed in any of a wide variety of patterns on the second surface 142 of RDL 134.

Figure 10:
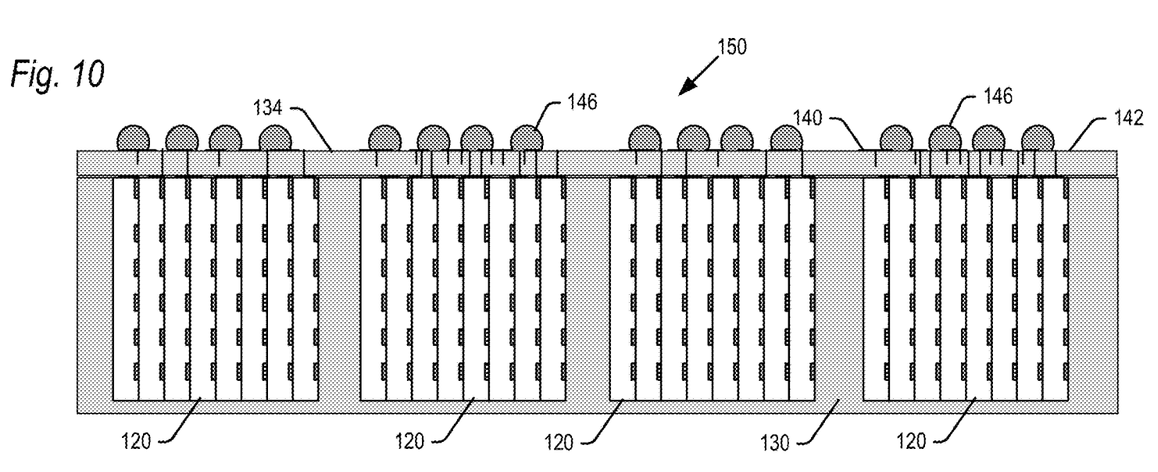
FIG. 10 is a cross-sectional edge view of a completed semiconductor device according to embodiments of the present technology.

In step 74, a pattern of solder balls 146 may be affixed to the contact pads 140 on the second surface 142 of RDL 134 as shown in FIG. 10 to form a completed semiconductor device 150. The solder balls 144 may be used to solder the semiconductor device 150 to a host device (not shown), such as a printed circuit board.

The semiconductor device 150 provides a high density array of semiconductor dies vertically mounted in a molded block. Such a semiconductor device 150 may be ideal for use as a solid-state drive providing a large memory capacity in a small form factor. As noted, the number of dies 102 in each die stack 120, and the number of die stacks 120 provided in the molded block, may vary depending on memory storage requirements. The semiconductor device 150 may be used in applications other than solid state drives in further embodiments.

In the embodiment described above, the semiconductor device 150 includes a number of die stacks 120 in a molded block. In a further embodiment, the die stacks 120 may be simulated after encapsulation to provide a semiconductor device including an individual encapsulated die stack. Such an embodiment will now be described with reference to the flowchart of FIG. 11, and the views of FIGS. 12-14.

Figure 12:
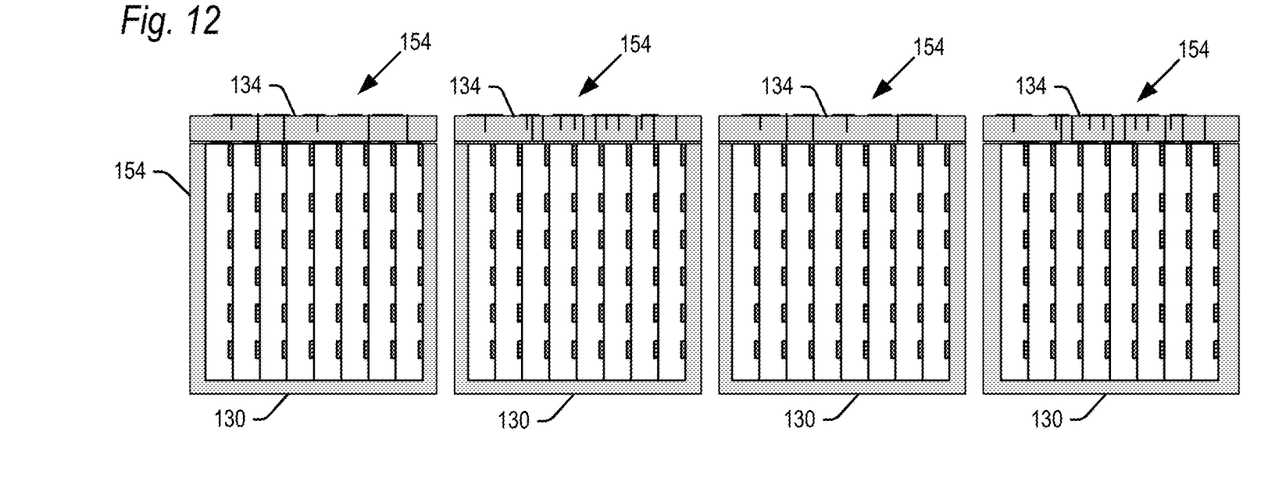
FIG. 12 is a cross-sectional edge view of encapsulated and singulated semiconductor die stacks according to embodiments of the present technology.

In the embodiment of FIGS. 11-14, steps 50-70 are repeated to provide a molded block of encapsulated die stacks 120 including RDL 134 (as shown in FIG. 9). In step 80, the molded block of encapsulated die stacks 120 may be singulated into molded blocks 154 each including an individual die stack 120 as shown in FIG. 12. In embodiments, solder balls may thereafter be formed on the contact pads 140 on the second surface 142 of RDL 134.

Figure 13:
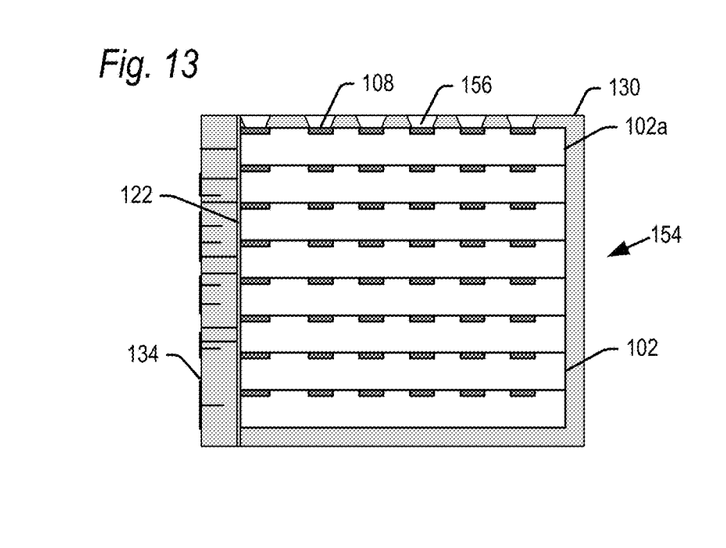
FIG. 13 is a cross-sectional edge view of a singulated die stack including through-mold vias according to embodiments of the present technology.

However, in a further embodiment, the individual blocks 154 may be rotated 90° so that the active sidewall 122 and RDL 134 faces to the side as shown in FIG. 13. Thereafter, in step 82 through-mold vias (TMVs) 156 may be formed down through the mold compound 130 to expose the contact pads 108 on an edge die 102a at the top (from the perspective of FIG. 13) of block 154. The TMVs may for example be formed mechanically with a drill or optically using a laser.

Figure 14:
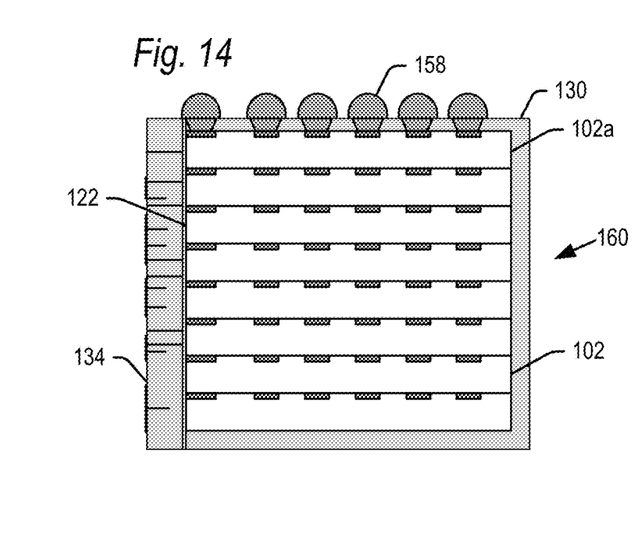
FIG. 14 is a cross-sectional edge view of a completed semiconductor device according to embodiments of the present technology.

In step 84, solder balls 158 may then be mounted to the die bond pads 108 of the edge die 102a as shown in FIG. 14 to form a completed semiconductor device 160. The solder balls 158 may be used to solder the semiconductor device 160 to a host device (not shown), such as a printed circuit board. The RDL 134 may be used to electrically couple the die 102 in the stack 120 in addition to the edge die 102a to the solder balls 158.

Forming the solder balls on this side of the individual blocks 154 has certain advantages. For example, given the thin profile of dies 102 in the die stack 120, forming the solder balls on top of the stacked dies provides a thin height package. In one example, device 160 may have a length of 20 mm, a width of 16 mm and a height of 1.0 mm. This is close to current memory device form factors used in mobile phones and other devices. However, as noted, the solder balls may be formed on the active sidewall 122 in further embodiments.

The semiconductor device 160 provides a high density array of semiconductor dies vertically mounted in a molded block. As noted, the number of dies 102 in each semiconductor device 160 may vary depending on memory storage requirements. The semiconductor device 160 may be used in a wide variety of applications, including for example solid state drives, cell phones, computers, cameras, etc.

In embodiments, the semiconductor devices 150, 160 may include purely memory semiconductor dies 102. However, in accordance with further aspects of the present technology, controller dies and/or other components may be incorporated into the semiconductor devices of the present technology to provide a full system on a chip. Such embodiments will now be described with reference to FIGS. 15-23.

Figure 15:
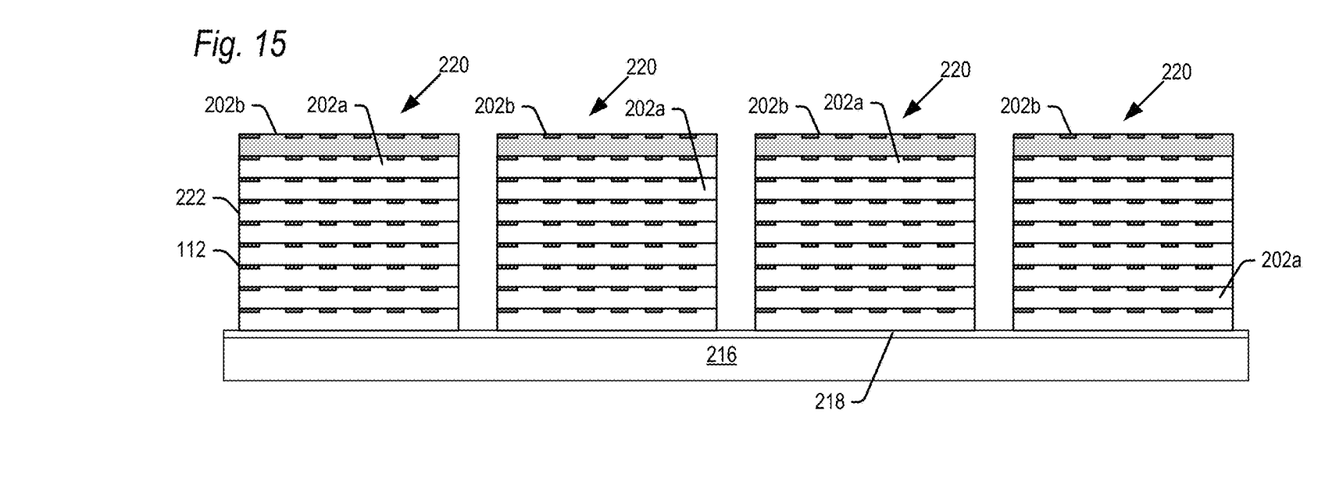
FIG. 15 is a perspective view of a number of die stacks supported on a first temporary carrier according to an alternative embodiment of the present technology.

FIG. 15 is a cross-sectional edge view of semiconductor die stacks 220 stacked on a first temporary carrier 216 by a temporary adhesive 218. Each die stack 220 may include semiconductor dies 202 comprising a number of memory die 202a and a controller die 202b such as an ASIC. The controller die 202b is shown at the top of the die stack 220 (from the perspective of FIG. 15), but the controller die 202b may be located elsewhere within the die stack 220 in further embodiments. As above, the die stacks 220 each include an active sidewall 222 comprising exposed edge bond pads 112.

Figure 16:
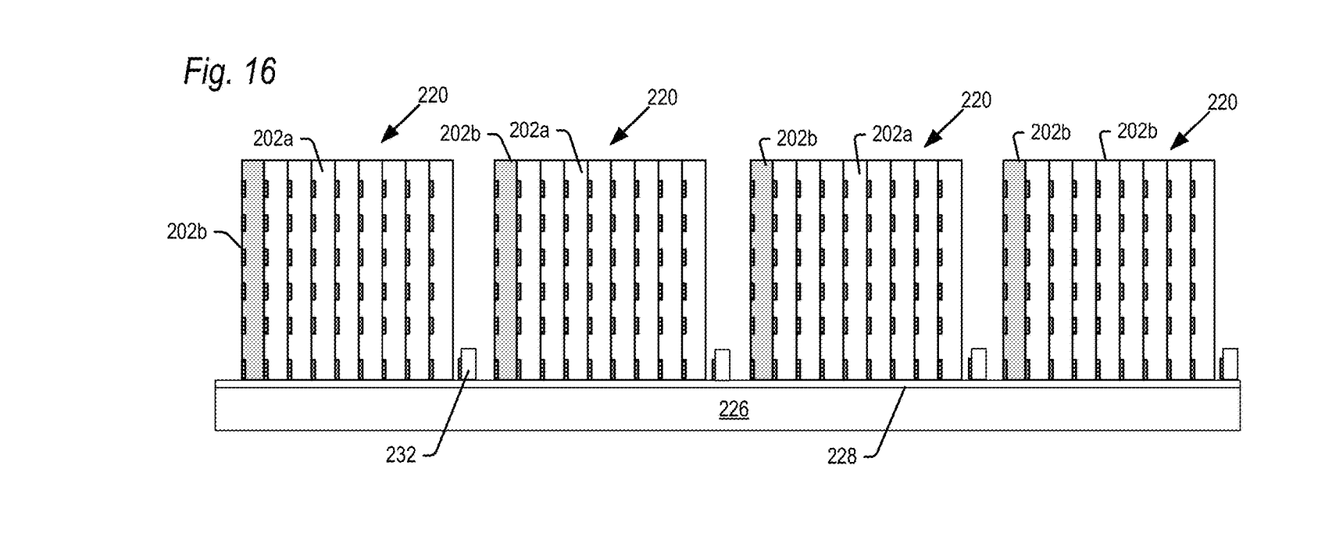
FIG. 16 is a perspective view of a number of die stacks supported on a second temporary carrier, with the active surface facing downward, according to an alternative embodiment of the present technology.

In FIG. 16, the die stacks 220 have been removed from the first carrier 216 by dissolving a temporary adhesive 218, rotated 90° so that the active sidewall 222 faces downward (from the perspective of FIG. 16) and mounted on a second carrier 226 by a temporary adhesive 228. In addition to die stacks 220, a variety of electronic components 232 may also be mounted on the temporary carrier 218. These electronic components 232 may for example include passive components such as capacitors, resistors and inductors. Electronic components 232 may be other components in further embodiments.

Figure 17:
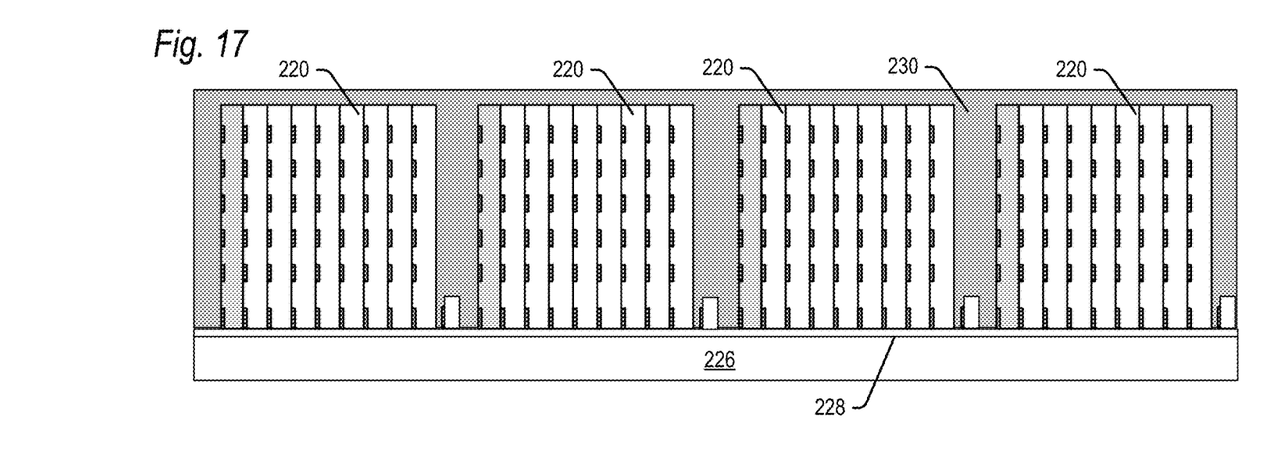
FIG. 17 is a cross-sectional edge view of semiconductor die stacks supported on a temporary carrier of FIG. 16 after encapsulation.
Figure 18:
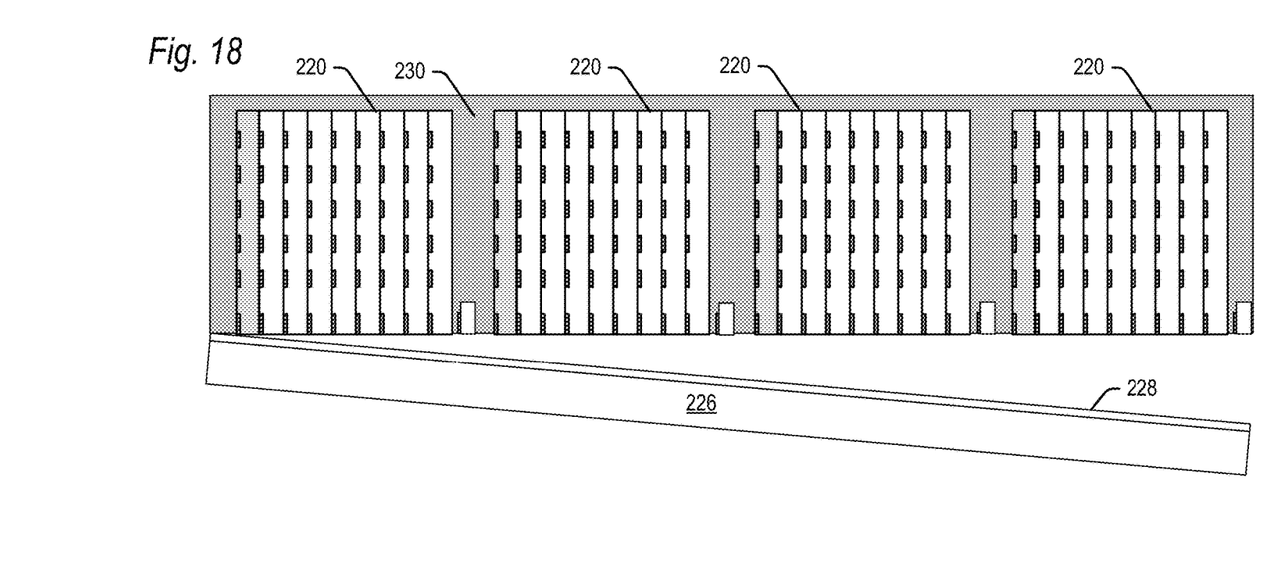
FIG. 18 is a cross-sectional edge view of encapsulated semiconductor die stacks with the temporary carrier of FIG. 17 being removed.

As shown in the cross-sectional edge view of FIG. 17, the die stacks 220 may next be encapsulated in a mold compound 230 as described above. Once the mold compound 230 has hardened, the second temporary carrier 226 may be removed as indicated in the cross-sectional edge view of FIG. 18. As above, the second temporary carrier 226 may be removed by applying laser/UV light, heat and/or force to the temporary adhesive 228 of the second carrier 226.

Figure 19:
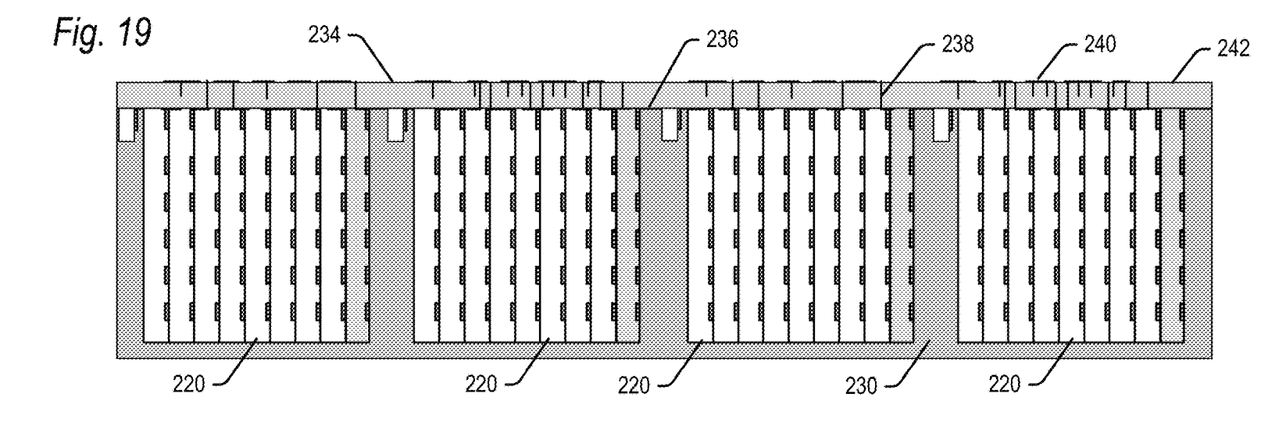
FIG. 19 is a cross-sectional edge view of the encapsulated semiconductor die stacks of FIG. 8, inverted, and including an RDL layer.
Figure 20:
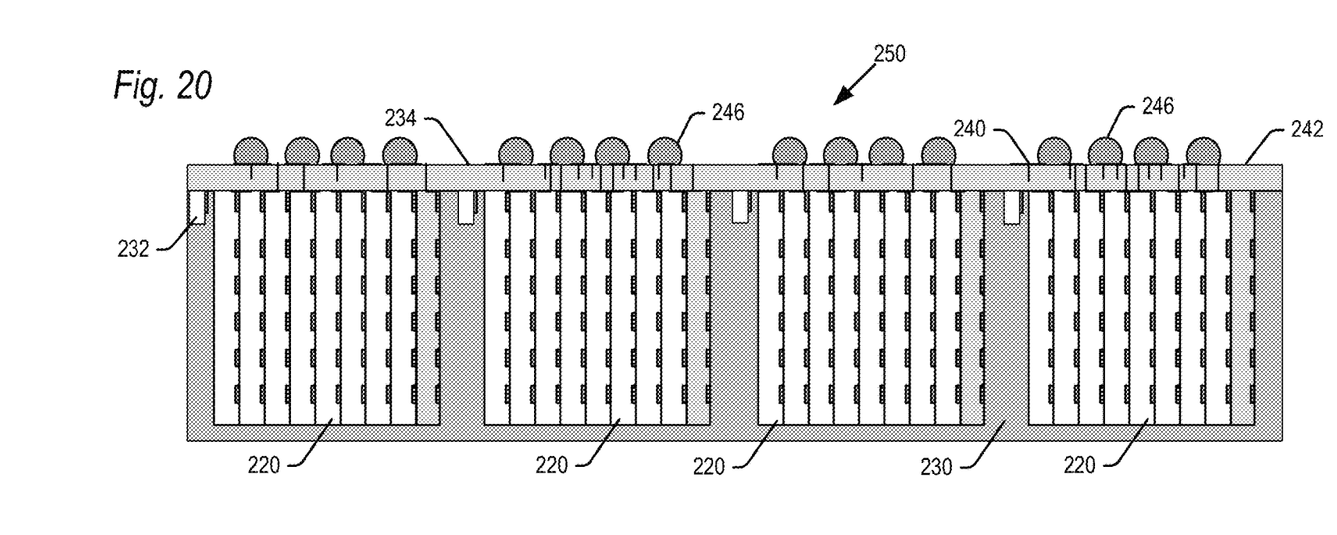
FIG. 20 is a cross-sectional edge view of a completed semiconductor device according to embodiments of the present technology.

The encapsulated die stacks 220 may next be inverted so that the active sidewalls 222 face upward as shown in FIG. 19. An RDL 234 may then be formed over the active sidewalls 222 of each of the die stacks 220 in mold compound 230. As described above, the RDL 234 may include a first surface 236, mounted to the molded block, including solder bumps which mate with the edge pads 112. The solder bumps are connected to contact pads 240 in a second surface 242 through metal interconnects 238. Solder balls 246 may then be affixed to the contact pads 240 on the second surface 242 of RDL 134 as shown in FIG. 20 to form a completed semiconductor device 250. The solder balls 144 may be used to solder the semiconductor device 250 to a host device (not shown), such as a printed circuit board.

The semiconductor device 250 provides a high density array of semiconductor dies vertically mounted in a molded block. Such a semiconductor device 250 may be ideal for use as a solid-state drive providing a large memory capacity in a small form factor. As above, the number of dies 202 in each die stack 220, and the number of die stacks 220 provided in the molded block, may vary depending on memory storage requirements. The semiconductor device 250 may be used in applications other than solid state drives in further embodiments.

The embodiment shown in FIG. 20 comprises a plurality of semiconductor die stacks 220 mounted in a molded block, where each die stack comprises memory dies 202a and a controller die 202b. In a further embodiment, a single stack 220 may comprise memory dies 202a and a controller die 202b, and the remaining stacks 220 comprise entirely memory dies 202a. In such an embodiment, the single controller die 202b in the molded block acts as the controller for all of the memory dies in all of the stacks 220.

Figure 21:
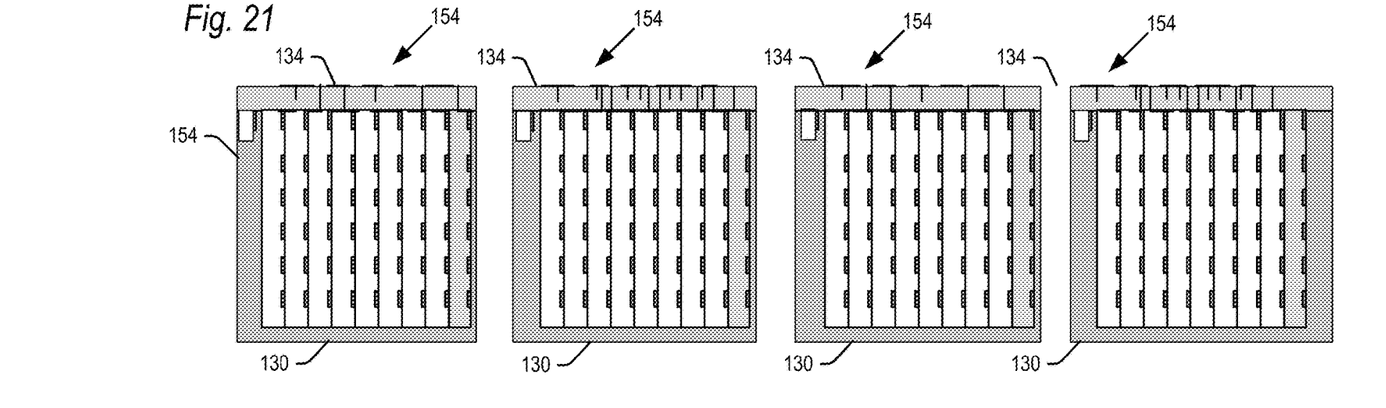
FIG. 21 is a cross-sectional edge view of encapsulated and singulated semiconductor die stacks according to an alternative embodiment of the present technology.

Instead of being used as a block of multiple die stacks 220, the semiconductor device of the present technology may be singulated into semiconductor devices comprising a single molded die stack 220. FIG. 21 shows the encapsulated block singulated into individual molded blocks 254, each including an individual die stack 220. In embodiments, solder balls may thereafter be formed on the contact pads 140 on the second surface 242 of RDL 234.

Figure 22:
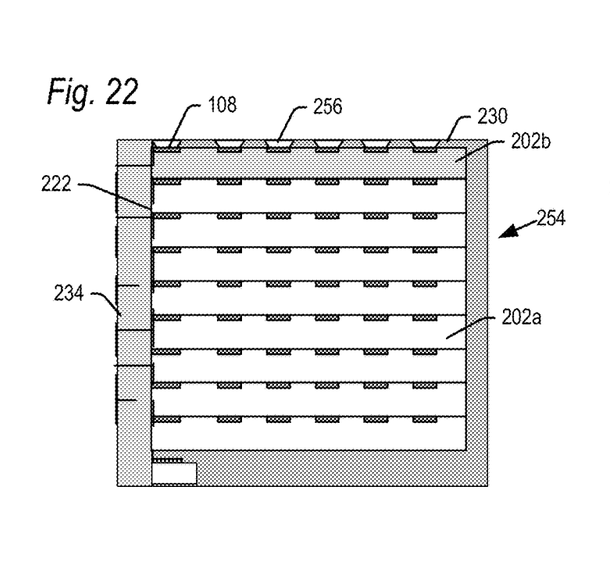
FIG. 22 is a cross-sectional edge view of a singulated die stack including through-mold vias according to an alternative embodiment of the present technology.
Figure 23:
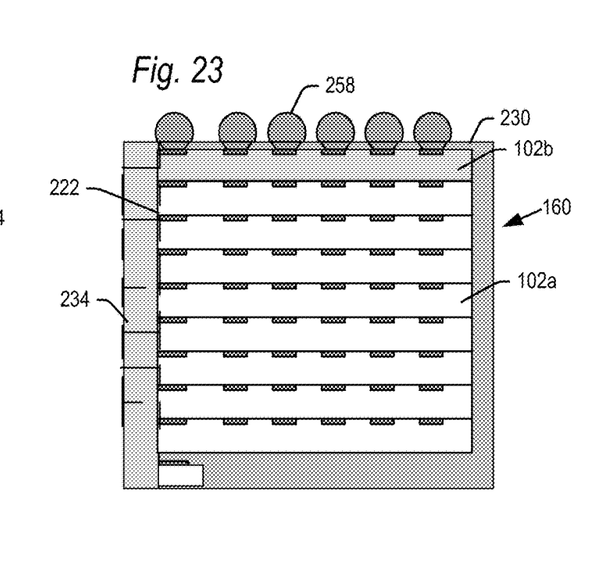
FIG. 23 is a cross-sectional edge view of a completed semiconductor device according to embodiments of the present technology.

However, in a further embodiment, the individual blocks 254 may be rotated 90° so that the active sidewall 222 and RDL 234 faces to the side as shown in FIG. 22. Thereafter, TMVs 256 may be formed down through the mold compound 230 to expose the contact pads 108 on, for example, the controller die 202b, at the top (from the perspective of FIG. 22) of block 254. Next, solder balls 258 may then be mounted to the die bond pads 108 of the controller die 202b as shown in FIG. 23 to form a completed semiconductor device 260. The solder balls 258 may be used to solder the semiconductor device 260 to a host device (not shown), such as a printed circuit board. The RDL 234 may be used to electrically couple the die 202 in the stack 220 in addition to the edge die 102a to the solder balls 258.

The semiconductor device 260 provides a high density array of semiconductor dies vertically mounted in a molded block. As noted, the number of dies 202 in each semiconductor device 260 may vary depending on memory storage requirements. The semiconductor device 260 may be used in a wide variety of applications, including for example solid state drives, cell phones, computers, cameras, etc.

In summary, an example of the present technology relates to a semiconductor device, comprising: a plurality of stacks of semiconductor dies molded together in an encapsulated block, each stack of semiconductor dies comprising: two or more semiconductor dies, each semiconductor die comprising: a plurality of bond pads on a first surface of the die, and a plurality of edge pads, formed in or on the first surface and extending to an active edge of the semiconductor die adjacent to the first surface, the plurality of edge pads electrically coupled to the plurality of bond pads, the active edges of the two or more semiconductor dies aligned to form an active sidewall; a redistribution layer formed on the active sidewalls of the plurality of stacks of semiconductor dies, the redistribution layer electrically redistributing the positions of the edge pads to fan out positions on a surface of the redistribution layer; and a plurality of solder balls, electrically coupled to the fan out positions of the redistribution layer, configured to electrically connect the semiconductor device to a host device.

In another example, the present technology relates to a semiconductor device, comprising: a stack of semiconductor dies, comprising: two or more semiconductor dies, each semiconductor die comprising: a plurality of bond pads on a first surface of the die, and a plurality of edge pads, formed in or on the first surface and extending to an active edge of the semiconductor die adjacent to the first surface, the plurality of edge pads electrically coupled to the plurality of bond pads, the active edges of the two or more semiconductor dies aligned to form an active sidewall; mold compound encapsulating the stack of semiconductor dies into a molded block with the active sidewall left exposed; a redistribution layer formed on the active sidewall of the stack of semiconductor dies, the redistribution layer electrically coupling the die bond pads of the two or more semiconductor dies; and a plurality of solder balls formed in through-mold vias through a surface of the mold compound and electrically coupled to the die bond pads of a semiconductor die of the stack of semiconductor dies, the solder balls configured to electrically connect the semiconductor device to a host device.

In a further example, the present technology relates to a semiconductor device, comprising: a stack of semiconductor dies, comprising: two or more semiconductor dies, each semiconductor die comprising: bond pad means for electrically connecting integrated circuits in the semiconductor die to a first surface of the semiconductor die, and edge pad means for electrically coupling the bond pad means to an active edge of the semiconductor die adjacent to the first surface, the active edges of the two or more semiconductor dies aligned to form an active sidewall; mold compound encapsulating the stack of semiconductor dies into a molded block with the active sidewall left exposed; redistribution means, formed on the active sidewall of the stack of semiconductor dies, for electrically coupling the die bond pads of the two or more semiconductor dies; and conductive ball means, formed in through-mold vias through a surface of the mold compound and electrically coupled to die bond pads of a semiconductor die of the stack of semiconductor dies, for electrically connecting the semiconductor device to a host device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
 a plurality of stacks of semiconductor dies molded together in an encapsulated block, each stack of semiconductor dies comprising:
  two or more semiconductor dies, each semiconductor die comprising:
   a plurality of bond pads on a first surface of the die, and
   a plurality of edge pads, formed in or on the first surface, spaced from the plurality of bond pads on the first surface and extending to an active edge of the semiconductor die adjacent to the first surface,
   electrical interconnectors electrically coupling the plurality of edge pads to the plurality of bond pads, the active edges of the two or more semiconductor dies aligned to form an active sidewall;

a redistribution layer formed on the active sidewalls of the plurality of stacks of semiconductor dies, the redistribution layer electrically redistributing the positions of the plurality of edge pads to fan out positions on a surface of the redistribution layer; and a plurality of solder balls, electrically coupled to the fan out positions of the redistribution layer, configured to electrically connect the semiconductor device to a host device.

2. The semiconductor device of claim 1, wherein the plurality of stacks of semiconductor dies are stacked horizontally on a first temporary carrier, and subsequently stacked vertically on a second temporary carrier.

3. The semiconductor device of claim 2, wherein the plurality of stacks of semiconductor dies are encapsulated in mold compound into the encapsulated block on the second temporary carrier.

4. The semiconductor device of claim 1, wherein each stack of the plurality of stacks of semiconductor dies comprises a plurality of flash memory dies.

5. The semiconductor device of claim 4, wherein each stack of the plurality of stacks of semiconductor dies further comprises a controller die controlling the plurality of flash memory dies in each of the plurality of stacks.

6. The semiconductor device of claim 4, wherein one stack of the plurality of stacks of semiconductor dies further comprises a single controller die controlling the plurality of flash memory dies in all of the plurality of stacks.

7. The semiconductor device of claim 1, wherein each stack of the plurality of stacks of semiconductor dies further comprises electronic components.

8. The semiconductor device of claim 7, wherein the electronic components comprise passive components.

9. A semiconductor device, comprising:
a stack of semiconductor dies, comprising:
two or more semiconductor dies, each semiconductor die comprising:
a plurality of bond pads on a first surface of the die, and
a plurality of edge pads, formed in or on the first surface and extending to an active edge of the semiconductor die adjacent to the first surface,
electrical interconnectors electrically coupling the plurality of edge pads to the plurality of bond pads, the active edges of the two or more semiconductor dies aligned to form an active sidewall;
mold compound encapsulating the stack of semiconductor dies into a molded block with the active sidewall left exposed;
a redistribution layer formed on the active sidewall of the stack of semiconductor dies, the redistribution layer electrically coupling the plurality of bond pads of the two or more semiconductor dies; and
a plurality of solder balls formed in through-mold vias through a surface of the mold compound and electrically coupled to the plurality of bond pads of a semiconductor die of the stack of semiconductor dies, the plurality of solder balls configured to electrically connect the semiconductor device to a host device.

10. The semiconductor device of claim 9, wherein the semiconductor device is singulated from an encapsulated block comprising a plurality of the semiconductor devices.

11. The semiconductor device of claim 9, wherein the two or more semiconductor dies in the stack of semiconductor dies are stacked horizontally on a first temporary carrier, and subsequently stacked vertically on a second temporary carrier.

12. The semiconductor device of claim 11, wherein the stack of semiconductor dies is encapsulated in mold compound on the second temporary carrier.

13. The semiconductor device of claim 9, wherein the stack of semiconductor dies comprises a plurality of flash memory dies.

14. The semiconductor device of claim 13, wherein the stack of semiconductor dies further comprises a controller die controlling the plurality flash memory dies.

15. The semiconductor device of claim 9, wherein the plurality of solder balls are soldered to the plurality of bond pads of a controller die of the two or more semiconductor dies.

16. The semiconductor device of claim 9, wherein the plurality of solder balls are soldered to the plurality of bond pads of a flash memory die of the two or more semiconductor dies.

17. A semiconductor device, comprising:
a stack of semiconductor dies, comprising:
two or more semiconductor dies, each semiconductor die comprising:
bond pad means for electrically connecting integrated circuits in the semiconductor die to a first surface of the semiconductor die, and
edge pad means for electrically coupling the bond pad means to an active edge of the semiconductor die adjacent to the first surface,
electrical interconnectors electrically coupling the edge pad means to the bond pad means, the active edges of the two or more semiconductor dies aligned to form an active sidewall;
mold compound encapsulating the stack of semiconductor dies into a molded block with the active sidewall left exposed;
redistribution means, formed on the active sidewall of the stack of semiconductor dies, for electrically coupling the bond pad means of the two or more semiconductor dies; and
conductive ball means, formed in through-mold vias through a surface of the mold compound and electrically coupled to bond pad means of a semiconductor die of the stack of semiconductor dies, for electrically connecting the semiconductor device to a host device.

18. The semiconductor device of claim 17, wherein the stack of semiconductor dies comprises a plurality of flash memory dies.

19. The semiconductor device of claim 18, wherein the stack of semiconductor dies further comprises a controller die controlling the plurality flash memory dies.

20. The semiconductor device of claim 17, wherein the conductive ball means are soldered to bond pad means of a controller die of the two or more semiconductor dies.

* * * * *